United States Patent
Will et al.

(10) Patent No.: US 6,783,376 B2
(45) Date of Patent: Aug. 31, 2004

(54) FASTENING ARRANGEMENT HAVING A FASTENING PLATE AND EMPLOYMENT OF THE FASTENING ARRANGEMENT

(75) Inventors: Norbert Will, Heidenheim (DE);
Rainer Hebel, Heidenheim (DE);
Rudolf Minihoffer, Königsbronn (DE)

(73) Assignee: EPCOS AG, München (DE)

( * ) Notice: Subject to any disclaimer, the term of this patent is extended or adjusted under 35 U.S.C. 154(b) by 0 days.

(21) Appl. No.: 10/258,248

(22) PCT Filed: Mar. 9, 2001

(86) PCT No.: PCT/DE01/00911
§ 371 (c)(1),
(2), (4) Date: Oct. 10, 2002

(87) PCT Pub. No.: WO01/78474
PCT Pub. Date: Oct. 18, 2001

(65) Prior Publication Data
US 2003/0143060 A1 Jul. 31, 2003

(30) Foreign Application Priority Data
Apr. 10, 2000 (DE) .......................... 100 17 774

(51) Int. Cl.[7] .............................................. H01R 12/00
(52) U.S. Cl. ........................................ 439/83; 439/383
(58) Field of Search ............................ 439/83, 383–384

(56) References Cited

U.S. PATENT DOCUMENTS

| | | | |
|---|---|---|---|
| 2,171,441 A | | 8/1939 | Barry |
| 4,480,289 A | | 10/1984 | Huffman |
| 4,663,695 A | | 5/1987 | Ohkawara et al. |
| 4,863,389 A | * | 9/1989 | Kobari et al. .................. 439/83 |
| 4,881,906 A | * | 11/1989 | Mackanic et al. ............. 439/83 |
| 4,902,237 A | | 2/1990 | Huetson |
| 5,199,887 A | * | 4/1993 | Iacono ......................... 439/83 |
| 5,203,077 A | * | 4/1993 | Reddy .......................... 29/840 |
| 5,210,937 A | * | 5/1993 | Delamoreaux ............... 29/839 |
| 5,295,862 A | * | 3/1994 | Mosquera .................... 439/567 |
| 5,573,172 A | | 11/1996 | Gore |
| 5,880,926 A | | 3/1999 | Nishino et al. |
| 6,224,389 B1 | | 5/2001 | Macia |

FOREIGN PATENT DOCUMENTS

| | | |
|---|---|---|
| DE | 297 04 600 | 6/1997 |
| DE | 196 54 382 | 6/1998 |

OTHER PUBLICATIONS

Abstract of Japanese Application 03–050895 of Mar. 5, 1991, *Patent Abstracts of Japan*, 1991.
Abstract of Japanese Application 06–021603 of Jan. 28, 1994, *Patent Abstracts of Japan*, 1994.

* cited by examiner

*Primary Examiner*—Truc Nguyen
(74) *Attorney, Agent, or Firm*—Schiff Hardin LLP

(57) ABSTRACT

A fastening arrangement uses a fastening plate for fastening a component on a printed circuit board. The fastening plate has incisions that separate the direct connections between the printed circuit board fastening points and the component fastening points of the fastening plate. Over and above this, the invention is directed to the employment of the fastening plate. Due to the incisions in the fastening plate, a solder star electrolytic capacitor having high resistance to oscillation is obtained and can be advantageously utilized in the automotive sector.

20 Claims, 3 Drawing Sheets

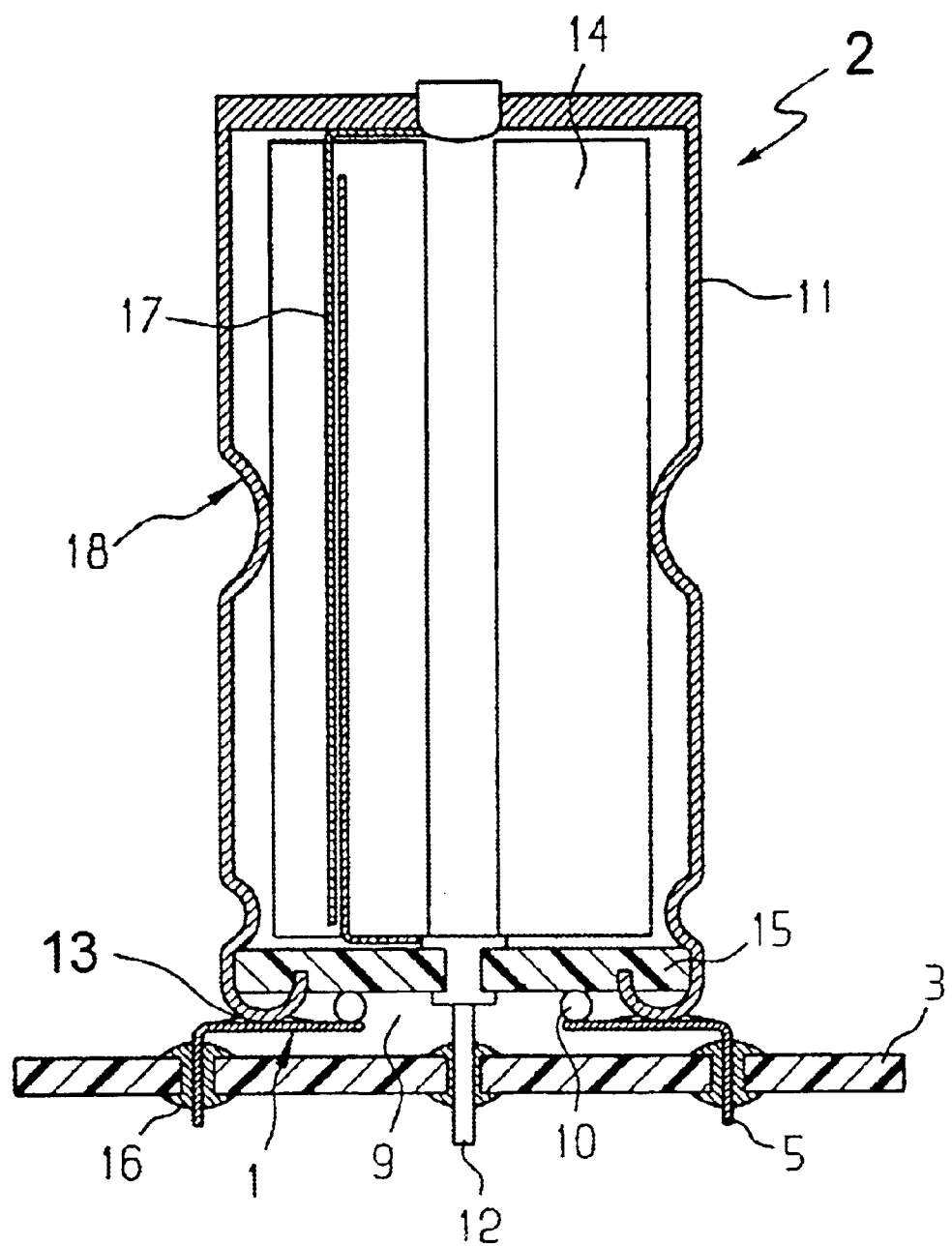

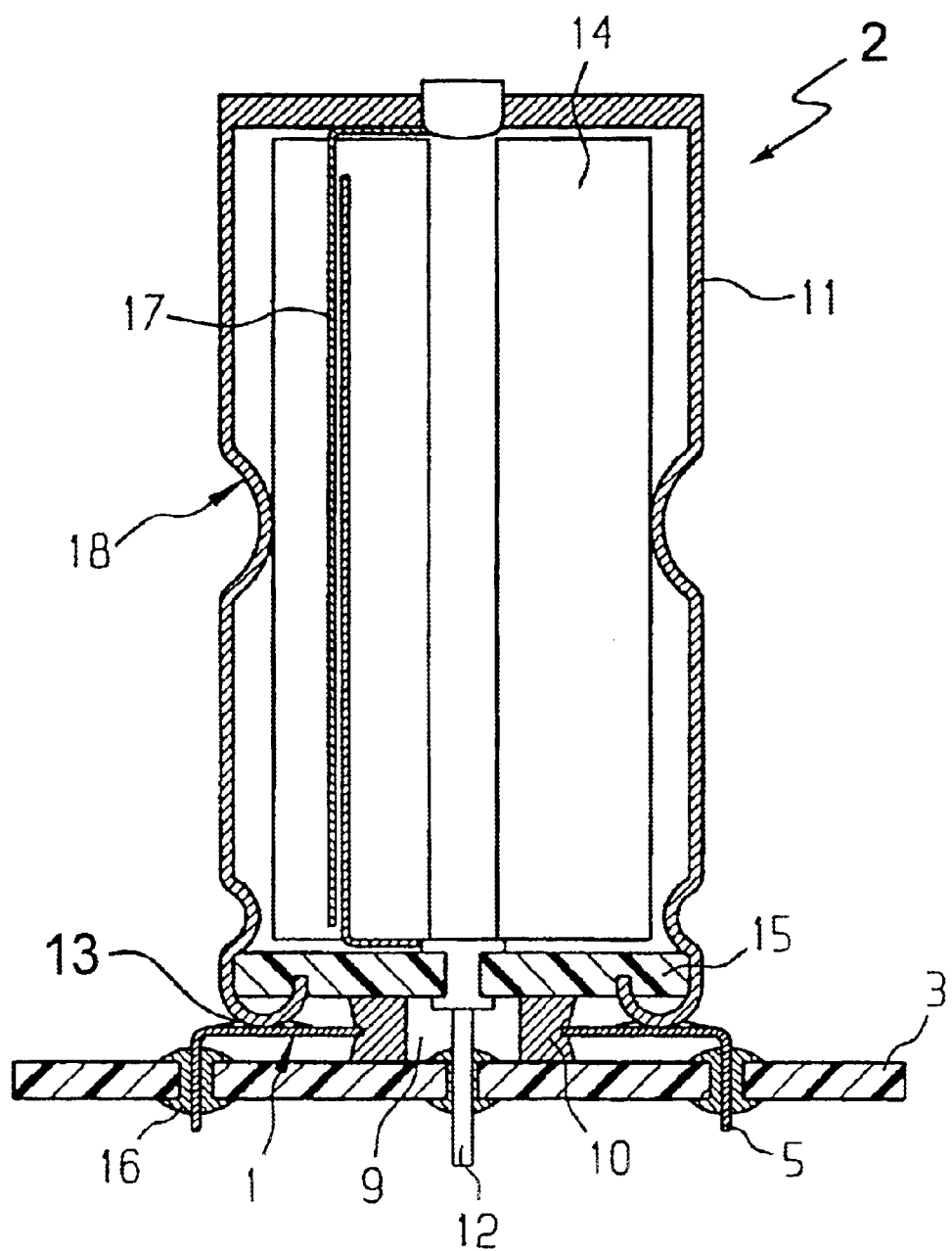

FASTENING ARRANGEMENT HAVING A FASTENING PLATE AND EMPLOYMENT OF THE FASTENING ARRANGEMENT

BACKGROUND OF THE INVENTION

The invention is directed to a fastening plate for fastening a component on a printed circuit board. The plate has means arranged on either the top or bottom side or surface facing printed circuit board fastening points for rigid fastening of the plate to the printed circuit board and has means arranged on the other of the top and bottom surface facing component fastening points for rigid fastening of the component to the fastening plate. The invention is also directed to a fastening arrangement having the fastening plate. Over and above this, the invention is directed to the employment of the fastening arrangement with the fastening plate.

Fastening plates of the species initially cited are known wherein the printed circuit board fastening points are directly connected to the component fastening points via the fastening plate. A largely rigid connection of the fastening points results therefrom.

The known fastening plates have the disadvantage that mechanical oscillations can be directly transmitted from the printed circuit board onto the component via the fastening plate. Due to the direct connection between the fastening points, this oscillation is hardly attenuated. This particularly takes effect where the printed circuit board with the component mounted on it is installed in oscillating systems, for example internal combustion motors of motor vehicles. The oscillatory load resulting therefrom can damage or even entirely destroy the component.

SUMMARY OF THE INVENTION

It is therefore a goal of the present invention to offer a fastening plate that largely avoids the transmission of mechanical oscillations from the printed circuit board onto the component.

This goal is inventively achieved by a fastening plate for fastening a component on a printed circuit board that comprises means for rigid fastening of the printed circuit board on the fastening plate. These means are arranged at the printed circuit board fastening points. The printed circuit board is to be arranged for fastening at one side of the fastening plate. In addition, the inventive fastening plate comprises means for the: rigid fastening of the component on the fastening plate. For fastening on the fastening plate, the component is to be arranged at one side of the fastening plate. In addition, the fastening plate comprises an incision that parts or separates the direct connection between a printed circuit board fastening point and a directly neighboring component fastening point.

The fastening of the component or, respectively, of the printed circuit board on the fastening plate can, for example, ensue with soldering or welding. The inventive fastening plate has the advantage that the flexural stiffness of the fastening plate is reduced by the incision, and as a result whereof the fastening plate can itself at least partially absorb the oscillatory energy potentially introduced from the printed circuit board. The oscillatory energy is thus no longer transmitted from the printed circuit board onto the component via the direct connection between a printed circuit board fastening point and a neighboring component fastening point.

The reduced transmission of oscillatory energy from the printed circuit board onto the component has the advantage that the fastening of the component on the fastening plate, for example a weld, is relieved. These fastening points are no longer destroyed as fast.

In addition, the inventive fastening plate has the advantage that, due to the reduced transmission of oscillations from the printed circuit board onto the component, the component itself or, respectively, oscillation-sensitive component parts situated in the component are also relieved.

The fastening of the fastening plate on the printed circuit board can, for example, ensue by means of pins of the plate projecting from the plane of the plate. These pins are plugged through corresponding holes in the printed circuit board and soldered there.

The fastening of the component on the fastening plate can advantageously ensue by welding. A fastening plate is therefore especially advantageous wherein weld surfaces suitable for welding a metal are arranged at the component fastening points.

In addition, a fastening plate that is electrically conductive is especially advantageous. Together with a further electrically conductive connection between fastening plate and printed circuit board, for example with the assistance of the aforementioned pins, which can be conductive, a two-pole electrical contact between printed circuit board and component can thus be realized by means of the fastening.

Such an electrically conductive fastening plate can, for example, be realized in that the fastening plate is fabricated of metal. For example, copper or a nickel-iron spring material as well come into consideration as the metals.

In addition, a fastening plate that is spring-elastic is especially advantageous since it is especially well-suited for absorbing and damping oscillations that proceed from the printed circuit board.

The incision of the fastening plate can be especially easily realized by means of a simple cutting when it proceeds from the edge of the fastening plate. In addition, a fastening plate is especially advantageous wherein the incision proceeds in the direction toward the center point of the fastening plate. Such a fastening plate has the advantage that, with the incision, the transport of the mechanical oscillatory energy also proceeds in the direction onto the center point of the fastening plate, for example towards the mid-point. As a result thereof, an optimally large part of or, respectively, nearly the entire fastening plate is involved in the oscillatory event, as a result whereof the damping properties are improved even further.

What is also achieved due to the course of the incision in the direction toward the center of the fastening plate is that an oscillation must first run into the inner part of the fastening plate in order to proceed from a printed circuit board fastening point to the neighboring component fastening point separated therefrom by the incision. The damping of the fastening plate is additionally improved by this long running distance.

In addition, a fastening plate is especially advantageous wherein the incision forms a planar recess in the fastening plate. Such a planar recess can, for example, be realized by cutting the fastening plate proceeding from the edge in the direction of the center of the fastening plate and by conducting the incision out from the inside of the fastening plate back to the edge of the fastening plate. Such a planar recess has the advantage that no tilting of the of the edge sections of the fastening plate formed by the incision is possible since the edges are spaced from one another. The fastening plate can thus oscillate unimpeded and optimally absorb the oscillatory energy introduced from the printed circuit board.

It is especially advantageous for an incision that proceeds from a point at the edge of the fastening plate into the inside of the fastening plate and from thence onto another point at the edge of the fastening plate when the incision is free of corners. Such a round incision or cutout has the advantage that no point for stress concentration or a stress raiser at the edge of the cutout in the fastening plate is formed by the incision. Such stress raiser would occur at locations at which the incision has corners. This lack of a stress raiser in the fastening plate also prevents a breakage of the fastening plate given especially high oscillatory amplitudes.

In addition, a fastening plate that comprises the shape of a circular disk is especially advantageous. Such a fastening plate is especially advantageous for fastening cylindrical components such as, for example, wound capacitors.

In addition, a fastening plate that comprises a center hole is especially advantageous. A contact pin of the component secured on the fastening plate can be conducted through this center hole and be contacted with the printed circuit board at the other side of the fastening plate. The electrical contacting of the component is considerably simplified as a result thereof. The center hole in the fastening plate also denotes the possibility of saving material and weight.

In addition, a fastening plate that comprises a plurality of incisions is especially advantageous. With the assistance of a plurality of incisions, a fastening plate can be realized wherein all connections between a printed circuit board fastening point and a neighboring component fastening point are separated. As a result thereof, the oscillation-damping properties of the fastening plate are optimized, since each printed circuit board fastening point is now decoupled from the directly neighboring component fastening point.

In addition, such a fastening plate has the advantage that the flexural stiffness is reduced further. As a result thereof, the fastening plate can absorb even more oscillatory energy.

Over and above this, a fastening plate is especially advantageous that comprises a damping element for mechanical oscillations at the side at which the component is to be arranged. Due to the reduced flexural stiffness of the fastening plate, a pronounced relative motion between the fastening plate and the printed circuit board on the one hand and between the fastening plate and the component on the other hand arises given an oscillating printed circuit board. With the assistance of the damping elements, this localized, pronounced relative motion is excellently suited for reducing the transmission of the oscillation between the printed circuit board and the component. The damping element arranged on the fastening plate thus has the advantage that a great oscillation-damping effect can be achieved by means of what is a very limited use of the damping material in terms of amount.

A damping element can also be advantageously arranged at that side of the fastening plate at which the printed circuit board is to be arranged. Here, too, an effective damping of the mechanical oscillations is easily possible. An even better oscillation-damping effect is obtained in that a damping element for the mechanical oscillations is arranged at both sides of the fastening plate.

The invention also specifies a fastening arrangement having a fastening plate, a component and a printed circuit board, whereby the printed circuit board is arranged at one side of the fastening plate and is rigidly connected to the fastening plate at printed circuit board fastening points. Over and above this, the component given the inventive fastening arrangement is arranged at one side of the fastening plate and rigidly connected to the fastening plate at the component fastening points.

The fastening plate also comprises an incision that parts or separates the direct connection between a printed circuit board fastening point and a neighboring component fastening point. Such a fastening arrangement has the advantage that the inventive fastening plate is advantageously utilized for damping the oscillations that are transmitted from the printed circuit board onto the component.

The inventive fastening arrangement can be especially advantageously configured in that a damping element for the mechanical oscillations is arranged between the fastening plate and the printed circuit board, and the damping element presses the fastening plate onto the printed circuit board. What the pressing of the damping element onto the printed circuit board assures is that the damping element touches both the fastening plate as well as the printed circuit board, as a result whereof an optimum oscillation damping is produced.

Just as advantageously, a damping element for mechanical oscillations can be arranged between the component and the fastening plate, whereby the damping element is pressed onto the fastening plate by the component. Here, too, a direct mechanical contact is guaranteed between the damping element and the component on the one hand and between the damping element and the fastening plate on the other hand. The transmission of the oscillatory energy onto the damping element is especially facilitated by the direct mechanical contact.

Over and above this, it is especially advantageous to arrange a damping element between the fastening plate and the printed circuit board as well as between the fastening plate and the component. The oscillatory damping is improved even more as a result of this arrangement.

Over and above this, a fastening arrangement is especially advantageous wherein the component comprises a contact pin that projects through a center hole in the fastening plate and is soldered to the printed circuit board. Such a fastening arrangement has the advantage that one of the electrical contactings of the component can be especially easily implemented. It is especially advantageous when an additional electrical contact of the component to the printed circuit board is mediated via the fastening plate itself. To this end, it is necessary that the fastening plate comprise electrically conductive properties.

It is also necessary, therefore, that the rigid connections between the component and the fastening plate on the one hand as well as between the fastening plate and the printed circuit board on the other hand are electrically conductively implemented. This, for example, can be realized with solder or, respectively, welded connections.

The invention also specifies the employment of the fastening plate for fastening a capacitor on a printed circuit board. The printed circuit board is thereby provided for installation in the immediate proximity of the internal combustion engine of a motor vehicle. The employment of the fastening plate is especially advantageous here because the mechanical oscillations of the motor are effectively damped and are only slightly transmitted onto the capacitor. As a result thereof, the connection of the capacitor to the fastening plate as well as the capacitor itself are protected against the oscillations. The inventive fastening plate is particularly suited for keeping the high-frequency oscillations with frequencies>1 kHz away from the capacitor.

The invention is explained in greater detail below on the basis of exemplary embodiments and the Figures appertaining thereto.

BRIEF DESCRIPTION OF THE DRAWINGS

FIG. 3 is a schematic cross-sectional view of a fastening arrangement according to the invention; and FIG. 4 is a schematic cross-sectional view of another fastening arrangement according to the invention.

DESCRIPTION OF THE PREFERRED EMBODIMENTS

Figure 1:
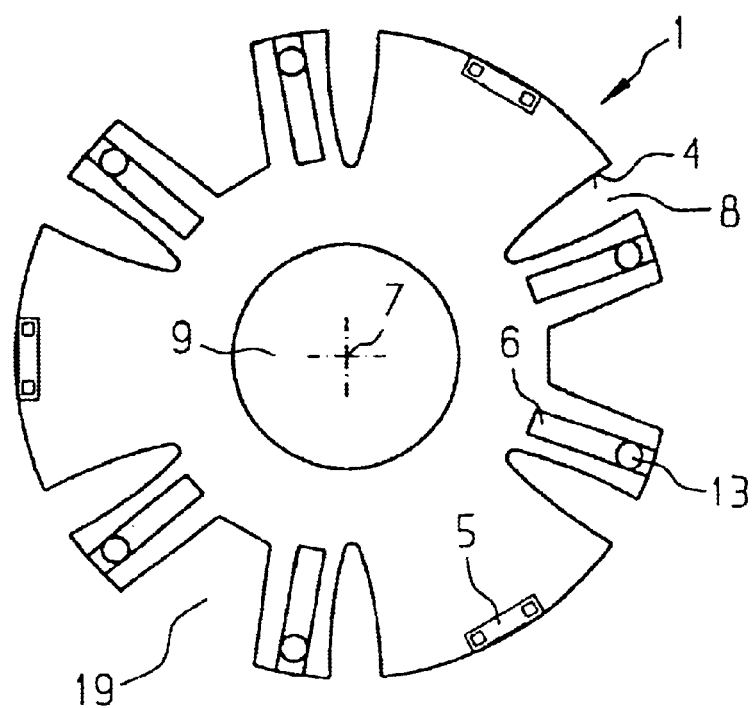
FIG. 1 is a schematic plan view of an inventive fastening plate.

FIG. 1 shows a fastening plate 1 that comprises the shape of a round disk. The fastening plate 1 comprises pins 5 directed into the plane of the drawing that serve for fastening the fastening plate 1 on a printed circuit board. In addition, the fastening plate 1 has weld surfaces 6 that are suitable for soldering a metal fast to the fastening plate 1. For example, this metal can be the metal housing of a component. A component that touches the fastening plate 1 with points lying on a circular line is secured on the fastening plate 1 with the assistance of welds or solder connections 13 arranged along a circular line and connections 13 form component fastening points.

The fastening plate 1 comprises incisions 4 that are conducted from the edge of the fastening plate 1 in the direction toward the center 7 of the fastening plate 1 and from thence back to the edge of the fastening plate 1. As a result of this guidance of the incision 4, recesses or cutouts 8 are produced in the fastening plate 1. The incisions 4 are shaped so that they are free of corners over their entire length. The incisions 4, just like the recesses or cutouts 8, are oriented to the center 7 of the fastening plate 1, as a result whereof an optimum decoupling of the pins 5 from the adjacent or neighboring component fastening points formed by the welds or solder connections 13 arises.

In the middle, the fastening plate 1 has a center hole 9 through which a contact pin of a component to be arranged over the fastening plate 1 can project and be plugged into the printed circuit board to be arranged under the fastening plate 1 and contacted thereat. Additional parting incisions 19 part or separate two respective welds 13.

Figure 2:
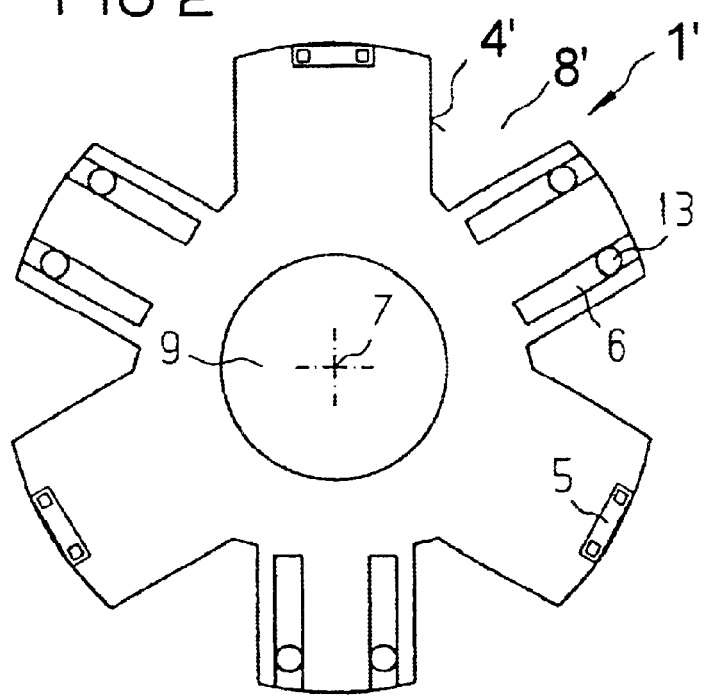
FIG. 2 is a schematic plan view of another exemplary, inventive fastening plate.

FIG. 2 shows a fastening plate 1' that is similar to the plate 1 in FIG. 1. In contrast to the fastening plate 1 shown in FIG. 1, two neighboring welds or fastening points 13 are not separated from one another by a parting incision 19 and the number of incisions 4' and cutouts 8' are reduced. Thus, the outlay for the production of the plate 1' is reduced compared to the fastening plate 1 shown in FIG. 1.

FIG. 3 shows a component, generally indicated at 2, implemented as an electrolytic capacitor that is mounted on a printed circuit board 3 by means of a fastening plate 1. The electrolytic capacitor comprises a capacitor winding 14 that is contacted, on the one hand, to a metal housing 11 and, on the other hand, to a contact pin 12. For example, the metal housing 11 can be composed of aluminum. The contacting thereby ensues via contact elements 17. The capacitor winding 14 is fixed in position relative to the metal housing 11 by means of an all around center or annular bead 18, so that it does not dislocate all that easily given mechanical oscillations of the metal housing, and as a result whereof a potential tearing of the contact elements 17 is prevented.

At its side facing toward the fastening plate 1, the electrolytic capacitor is protected by seal elements 15 from leakage of the electrolyte and from the penetration of moisture into the capacitor. An all-around projection that is rigidly connected to the fastening plate 1 at welds 13 is arranged at the underside of the electrolytic capacitor. The fastening plate 1 is provided with pins 5 that are soldered into the holes of a printed circuit board 3 by means of solder 16.

The fastening plate 1 can, for example, be composed of an electrically conductive material, so that the pins 5 assure an electrical contacting of the electrolytic capacitor to the printed circuit board 3. The second contacting of the printed circuit board 3 to the electrolytic capacitor is accomplished by the contact pin 12 that is likewise soldered into the printed circuit board 3.

The fastening plate 1 comprises a center hole 9 through which the contact pin 12 of the electrolytic capacitor projects. A damping element 10 that, for example, can be implemented as an 0-ring composed of an elastomer or as a rubber disk is arranged at the edge of the center hole 9. Oscillation tests wherein the printed circuit board 3 was subjected to accelerations between 20 and 30 times the earth's acceleration have shown that a fastening plate 1 that is implemented according to FIG. 1 assures that the electrolytic capacitor withstands an oscillatory load that is 1.3 times higher compared to a fastening with a fastening plate of the Prior Art.

FIG. 4 shows an electrolytic capacitor similar to that of FIG. 3 that is mounted on a printed circuit board 3 by means of a fastening plate 1. A damping element 10' is arranged at the center hole 9 of the fastening plate 1. This damping element 10' touches both the electrolytic capacitor 2 as well as the printed circuit board 3 and is pressed against the printed circuit board 3 by the electrolytic capacitor. An optimum oscillation damping is possible as a result thereof since the damping element 10' also touches the fastening plate 1, as a result whereof all oscillating components have mechanical contact with the damping element 10' and can transmit oscillatory energy onto the damping element 10'.

The invention is not limited to the embodiments shown by way of example but is defined in its most general form by the claims.

We claim:

1. A fastening plate for fastening a component on a printed circuit board, said plate having printed circuit fastening points on one surface and component fastening points on a second surface opposite the one surface, said plate having means arranged at the printed circuit fastening points for forming a rigid connection to a printed circuit board, means arranged at the component fastening points on the plate for forming rigid connections for a component, and an incision for separating a direct connection between a printed circuit board fastening point and a neighboring component fastening point, said incision extending inward from an outer edge of the plate.

2. A fastening plate according to claim 1, wherein the means for forming rigid connections to the printed circuit board comprises pins projecting from the plane of the plate.

3. A fastening plate according to claim 1, wherein the means for rigid fastening of the components are weld surfaces suitable for forming a weld connection to the component.

4. A fastening plate according to claim 1, wherein the plate is electrically conductive.

5. A fastening plate according to claim 1, wherein the fastening plate is composed of metal.

6. A fastening plate according to claim 1, wherein the fastening plate is composed of a spring-elastic metal.

7. A fastening plate according to claim 1, wherein the incisions proceed in the direction toward the center of the fastening plate.

8. A fastening plate according to claim 1, wherein the incision forms a planar cutout in the fastening plate.

9. A fastening plate according to claim 1, wherein the incision forms a cutout free of corners.

10. A fastening plate according to claim 1, wherein the plate has the shape of a circular disk.

11. A fastening plate according to claim 10, wherein the circular disk has a center hole.

12. A fastening plate according to claim 1, which has a plurality of incisions that separate all direct connections between the printed circuit board fastening point and a component fastening point.

13. A fastening plate according to claim 1, which includes a damping element for mechanical oscillations being disposed between a side of the plate and a component.

14. A fastening plate according to claim 1, which includes a damping element for mechanical oscillations being disposed on a side facing the printed circuit board.

15. A fastening arrangement comprising a fastening plate, a printed circuit board, and a component, said fastening plate having printed circuit fastening points on one surface and component fastening points on a second surface opposite the one surface, the plate having first means arranged on the printed circuit fastening points for forming tight rigid connections to the printed circuit board, said fastening plate having second means arranged on the component fastening points for forming a rigid connection to the component, said fastening plate having incisions that separate the direct connection between a printed circuit board fastening point and a neighboring component fastening point, said incisions extending inward from an outer edge of the plate.

16. A fastening arrangement according to claim 15, which includes a damping element for mechanical oscillations being disposed between the fastening plate and the printed circuit board.

17. A fastening arrangement according to claim 15, which includes a damping element for mechanical oscillations being pressed by the component onto the fastening plate.

18. A fastening arrangement according to claim 15, wherein the component has a metal housing which is welded to the fastening plates, wherein the first means are pins which are soldered to the printed circuit board.

19. A fastening arrangement according to claim 18, wherein the fastening plate has a center hole and the component has a contact pin extending through the center hole and being soldered to the printed circuit board.

20. A fastening arrangement according to claim 15, wherein the component is a capacitor and the circuit board and capacitor are for use in an internal combustion engine of a motor vehicle.

* * * * *